United States Patent
Petersen

(10) Patent No.: US 9,444,419 B2
(45) Date of Patent: Sep. 13, 2016

(54) BOOSTED DIFFERENTIAL CLASS H AMPLIFIER

(71) Applicant: Dialog Semiconductor GmbH, Kirchheim/Teck-Nabern (DE)

(72) Inventor: Holger Petersen, Germering (DE)

(73) Assignee: Dialog Semiconductor GmbH, Kirchheim/Tech-Nabern (DE)

( * ) Notice: Subject to any disclaimer, the term of this patent is extended or adjusted under 35 U.S.C. 154(b) by 269 days.

(21) Appl. No.: 13/714,532

(22) Filed: Dec. 14, 2012

(65) Prior Publication Data
US 2014/0169588 A1 Jun. 19, 2014

(30) Foreign Application Priority Data

Dec. 13, 2012 (EP) .................. 12368034

(51) Int. Cl.
*H03F 3/45* (2006.01)
*H03F 3/20* (2006.01)
*H03F 3/68* (2006.01)
*H03F 1/02* (2006.01)

(52) U.S. Cl.
CPC .............. *H03F 3/68* (2013.01); *H03F 1/0227* (2013.01); *H03F 3/20* (2013.01)

(58) Field of Classification Search
None
See application file for complete search history.

(56) References Cited

U.S. PATENT DOCUMENTS

| | | | |
|---|---|---|---|
| 6,104,248 A | 8/2000 | Carver | |
| 6,166,605 A | 12/2000 | Carver | |
| 6,792,121 B2 | 9/2004 | Koyama et al. | |
| 7,358,814 B2 | 4/2008 | Seaberg | |
| 7,701,294 B1 | 4/2010 | Yun | |
| 7,782,141 B2* | 8/2010 | Witmer et al. | 330/297 |
| 8,159,294 B2* | 4/2012 | Guo et al. | 330/127 |
| 8,411,879 B2* | 4/2013 | Guo et al. | 381/120 |
| 2006/0284673 A1 | 12/2006 | Peruzzi et al. | |
| 2008/0036542 A1 | 2/2008 | Chen et al. | |
| 2008/0279399 A1* | 11/2008 | Noro et al. | 381/120 |
| 2008/0290949 A1 | 11/2008 | Chen et al. | |
| 2009/0022339 A1 | 1/2009 | Sasaki | |
| 2010/0092010 A1* | 4/2010 | Lee | 381/120 |
| 2011/0221533 A1* | 9/2011 | Lesso | 330/297 |

FOREIGN PATENT DOCUMENTS

| | | |
|---|---|---|
| EP | 2 056 451 | 5/2009 |
| WO | WO 94/11799 | 5/1994 |
| WO | WO 95/15612 | 6/1995 |

OTHER PUBLICATIONS

European Search Report 12368034.30-1810 Mail date—May 6, 2013, Dialog Semiconductor GmbH.

(Continued)

*Primary Examiner* — Thang Tran
(74) *Attorney, Agent, or Firm* — Saile Ackerman LLC; Stephen B. Ackerman

(57) ABSTRACT

A differential audio amplifier system and a related system to generate an output signal free or with only very limited clipping are disclosed. It provides a solution to solve the problem of limited electrical speaker amplifier output power available (e.g. inside battery driver applications). A differential speaker amplifier has positive and negative supply rails. In a first embodiment of the disclosure the negative supply rail is connected to the output of an inverting buck-boost converter and the positive supply rail is directly connected to VSS voltage. In a second embodiment of the disclosure the positive supply rail is connected to the output of a buck-boost converter and the negative supply rail is directly connected to a positive battery voltage.

33 Claims, 2 Drawing Sheets

(56) References Cited

OTHER PUBLICATIONS

"Improvement of Power Efficiency for the Class-BD Amplifier with Final Bridge Circuits," by Masayoshi Mochimaur, 433b Electronics and Communications in Japan (Part II: Electronics), vol. 74, Issue 6, pp. 53-61, Jun. 1991.
"A Switchmode Power Supply Suitable for Audio Power Amplifiers," by Jay Gordon, Audio Engineering Society, Convention Paper 7570, Oct. 2-5, 2008, pp. 1-10.

* cited by examiner

BOOSTED DIFFERENTIAL CLASS H AMPLIFIER

BACKGROUND (1) Field of the Disclosure

This disclosure relates generally to amplifiers and relates more specifically to differential audio amplifiers.

(2) Description of the Prior Art

Portable (battery driven) devices usually suffer from limited acoustical loudness especially, when driving embedded mini-speaker. Besides the fact, that such mini-speakers offer a low sensitivity the electrical power capability of the (battery driven) speaker amplifier is one of the most critical factors.

In case the available speaker loudness is limited by the output power of the amplifier below current practice is known:

1.1 Increasing the Electrical Output Power by Lowering Speaker Impedance (e.g. From 8 to 4 O):

The maximum voltage swing stays the same but drives a higher current into the speaker. At the same time the ratio of speaker to connection track impedance is reduced. To stay efficient this requires routing and traces with very low resistance from the battery to the amplifier and from the amplifier towards speaker. On top 4 O speakers typically offer a lower sensitivity as similar to 8 O types (acoustical loudness versus electrical input power).

1.2 Increasing the Amplifier Efficiency by Using Switching Technology:

In the market of portable applications the dominant speaker amplifier type is Class AB. Class AB is widely considered a good compromise for audio amplifiers, since much of the time the music is quiet enough that the signal stays in the "class A" region, where it is amplified with good fidelity, and by definition if passing out of this region, is large enough that the distortion products typical of class B are relatively small. The crossover distortion can be reduced further by using negative feedback. Class B and AB amplifiers are sometimes used for RF linear amplifiers as well. Class AB amplifiers are also favored in battery-operated devices. These amplifiers do not emit any electro-magnetic interference (EMI) noise (from e.g. switching) and by that are compatible with noise sensitive components like RF transceivers. Class AB amplifiers can be configured to provide a good linearity. For a constant sine wave at maximum power they may achieve efficiency in the range of >63%, but in case of music/voice (with a natural crest factor of 15 dB) the average efficiency can drop down to 20%. The relative efficiency reduces even further in case the maximum signal swing is small in comparison to the supply voltage of the output stage.

The amplifier efficiency can be improved by using switching amplifier technology like e.g. Class D. The loss of the driver stage is manly minimized by either switching it OFF or completely ON from a modulated high frequency pulse density modulation (PDM) or pulse width modulation (PWM) signal. Class D amplifiers use switching to achieve very high power efficiency. By allowing each output device to be either fully on or off, losses are minimized. In case the analog output is created by pulse width modulation; the active element is switched on for shorter or longer intervals instead of modifying its resistance. In case of PDM the analog output is created by a higher or lower density of high pulses of a fixed duration. There are more complicated switching schemes like sigma-delta modulation, to improve some performance aspects like lower distortions or better efficiency.

The efficiency of a similar rated Class D amplifier may achieve 86% for tones at maximum amplitude, which typically stays >70% even for music and voice. The impact on maximum loudness in comparison to class AB type amplifier is limited, as only the difference in maximum efficiency will be gained (15-20%).

The output signal is created out of a PWM/PDM stream either using a cascaded LC filter or the parasitic inductance of the speaker coil itself. The first solution typically requires bulky and expensive discrete components, reduces the efficiency and introduces distortion to the audio signal. The second approach requires a routing of switched high current signals between amplifier and speaker. To limit in the latter case the cross talk towards other components enforces a shielded routing, which is complicated and not possible under all conditions. As a result both solutions have obvious disadvantages and by that Class D amplifiers so far have proven a limited market acceptance especially for noise sensitive applications like mobile phones, etc.

1.3 Running the Speaker Amplifier from a Fixed Boosted Supply Voltage:

Instead of increasing the electrical current into the speaker (see 1.1) another way towards higher amplifier output power is an increased voltage swing. But any amplitude above battery voltage (VBAT) requires a boosted amplifier supply voltage. As capacitive switching regulators typically are not strong enough to drive speaker amplifiers, inductive switching boost converters are usually implemented. In case of supplying a linear amplifier the overall efficiency is reduced by the loss of the boost converter, which can be dominant for low output amplitudes. This gets worse as higher the supply voltage has to be boosted. The boost efficiency in case of light load may be improved by discontinuous switching, but emitted noise signals will no longer have a well-defined frequency, which is unwanted for noise sensitive applications.

1.4 Class H/G Amplifiers with Boosted Supply Voltage:

To improve the efficiency of a linear amplifier its supply voltage can be regulated towards a minimum voltage drop over the pass devices of the output stages. Class G amplifiers switch between discrete supply voltage levels derived either from amplifier volume settings or the average signal level. For low power headphone amplifiers this is meanwhile state-of-art by using capacitive charge pumps allowing boosting of the amplifier supply voltage as well as supply voltage division. Capacitive charge pumps of reasonable size don't provide enough current for speaker drivers that mainly use inductive DC/DC regulators. The Class H amplifier regulates its supply voltage similar, but "step-less" and by that follows the envelope of the signal level with minimum margin. In case of boosted class G or H with regulation over the whole output amplitude range the DC/DC converter has to be a buck-boost converter. In case of a true buck-boost the drawback is relative high cost (larger die size than pure buck or pure boost converter), irregular switching pattern when input and output voltages are similar and increased loss of efficiency from two serial switches required inside the buck-boost regulator.

Inside portable applications of today one can find all above described solutions (partially in combination) to overcome the maximum loudness of playback via embedded mini-speakers.

It is a challenge for engineers designing speaker amplifiers to improve speaker loudness limited by the output power of the amplifier.

There are following solutions known in the field of speaker amplifiers:

U.S. Patent Publication (US 2009/0022339 to Sasaki) discloses an amplifier including an amplifying block for receiving an input signal to drive a speaker, and a power supply block for supplying an output voltage to the amplifying block. The amplifying block includes a PWM-signal generation circuit which converts the input signal into a PWM signal, a speaker driving circuit which drives the speaker based on the PWM signal, and a duty detection circuit which outputs a time difference signal proportional to a difference between the pulse width and the pulse interval of the PWM signal. The power supply block controls the output voltage thereof based on the time difference signal. If the volume of a speaker is loud, the amplifier increases the drive voltage of the speaker to suppress distortion of the volume.

U.S. Patent (U.S. Pat. No. 7,358,814 to Seaberg) discloses a differential audio amplifier including a differential input stage for producing an output voltage in response to a differential audio input signal. The differential input stage has a first bias voltage and a second basis voltage. A bias compensation module controls the first bias voltage to be substantially equal to the second bias voltage. An objective of the disclosure is to achieve an audio amplifier providing greater output voltage swings while maintaining low total harmonic distortion (THD).

U.S. Patent (U.S. Pat. No. 6,792,121 to Koyama et al.) proposes an audio signal amplifier circuit including an external output terminal of an IC to which an output line of a power amplifier circuit is connected, a first resistor connected between a certain terminal of the IC other than the external output terminal and a feedback input of a differential amplifier circuit, a first capacitor connected between the external output terminal and a loud speaker, a second capacitor between the certain terminal of the IC and a wiring line between the external output terminal and the loud speaker, a filter circuit provided on a signal input side of the differential amplifier circuit and including a second resistor and a third capacitor for attenuating signal components having frequencies in a middle and high frequency ranges and voltage follower means provided between an input stage and an output stage of the audio signal amplifier circuit, wherein the first capacitor is a small capacitor having a capacitance value in the order of 30 µF or smaller and an attenuation characteristics of the first capacitor and an impedance of the loud speaker in a low frequency range is compensated for by a relative amount of increase of amplification gain in the low frequency range determined by a time constant of the second capacitor and the first resistor and a time constant of the third capacitor and the second resistor.

SUMMARY

A principal object of the present disclosure is to improve loudness of applications driving small speakers from amplifiers supplied from a limited supply voltage (e.g. batteries).

A further object of the disclosure is to prevent EMI and cross talk issues of switching amplifiers used for maximum output power.

A further object of the disclosure is to remove the drawback of a non-fixed noise spectrum of boosted amplifiers running switching regulators in PFM or pulse-skipping mode to reduce switching loss during light load conditions.

In accordance with the objects of this disclosure a method to achieve a differential audio amplifier generating an output signal, free or with only very limited clipping, is disclosed. The method comprises the steps of: providing a differential speaker amplifier of a portable device, wherein the amplifier has a positive and negative supply rail, a supply voltage, and a DC/DC converter, a supply voltage, an inverting DC/DC converter, and a differential speaker amplifier of a portable device, wherein the amplifier has dynamic positive and negative supply rails, connecting the positive supply rail directly to VSS supply voltage, supplying the negative supply rail by an output of the inverting DC/DC converter; and shifting the arithmetic average of the input signals to the arithmetic average of the voltage levels of the positive and negative supply rails.

In accordance with the objects of this disclosure a differential audio amplifier system generating an output signal free or with only very limited clipping is disclosed. The amplifier firstly comprises: a differential amplifier having differential inputs and differential outputs and a positive and a negative supply rail, wherein the inputs are the outputs of a Vmid level shifter, a supply voltage, and said Vmid level shifter receiving a differential audio signal input, wherein the level shifter shifts the arithmetic average of the input signals to the arithmetic average of the voltage levels of the positive and negative supply rails. Furthermore the amplifier comprises said positive and negative supply rails, wherein the positive supply rail is directly connected to VSS voltage of the supply voltage and the negative supply rail is connected to an output of an inverting DC/DC converter, said inverting DC/DC converter supplying said negative supply, and a control block receiving inputs from the input signals and controlling said DC/DC converter and said Vmid level shifter.

In accordance with the objects of this disclosure a method to achieve a differential audio amplifier generating an output signal, free or with only very limited clipping, is disclosed. The method comprises the steps of: providing a supply voltage, a DC/DC converter, and a differential speaker amplifier of a portable device, wherein the amplifier has dynamic positive and negative supply rails, connecting the negative supply rail directly to a positive battery voltage, supplying the positive supply rail by an output of the DC/DC converter, and shifting the arithmetic average of the input signals to the arithmetic average of the voltage levels of the positive and negative supply rails.

In accordance with the objects of this disclosure a differential audio amplifier system generating an output signal free or with only very limited clipping is disclosed. The amplifier firstly comprises: a differential amplifier having differential inputs and differential outputs and positive and a negative supply rails, wherein the inputs are the outputs of a Vmid level shifter, a supply voltage, and said Vmid level shifter receiving a differential audio signal input, wherein the level shifter shifts the arithmetic average of the input signals to the arithmetic average of the voltage levels of the positive and negative supply rails. Furthermore the differential audio system comprises: said positive and negative supply rails, wherein the negative supply rail is directly connected to a positive battery voltage and the positive supply rail is connected to an output of a DC/DC converter, said DC/DC converter supplying said positive supply rail, and a control block receiving inputs from the input signals and controlling said DC/DC converter and said Vmid level shifter.

BRIEF DESCRIPTION OF THE DRAWINGS

In the accompanying drawings forming a material part of this description, there is shown.

DESCRIPTION OF THE PREFERRED EMBODIMENTS

Methods and apparatus to achieve a boosted differential amplifier with inverted supply voltage are disclosed. The amplifier invented is preferably applied as audio amplifier for mobile electronic devices.

The amplifier disclosed has been designed to achieve also high power efficiency. The power efficiency is measured by the total battery playtime. This can be derived from the time averaged power consumption of the amplifier.

A differential output stage has been selected for the amplifier disclosed so that DC-offset at the positive and negative output ports subtracts to zero at the connected speaker input. Also it has been defined that the mini-speaker output power should not be further increased by reducing the electrical impedance of the speaker. The full-scale signal is defined by the supply voltage (battery voltage) and by that the maximum electrical output power. It is assumed that the achievable loudness for a typical (portable) application using a small 8 O mini-speaker driven by an amplifier supplied by a single Li-Ion battery pack (VBAT~3.5 V) is not sufficient.

As linear amplifiers provide good efficiency when running at maximum output power the disclosure disclosed has following characteristics:

The speaker amplifier is supplied from a positive and negative rail.

The positive supply rail VDD_P is directly connected to a VSS supply voltage.

The negative supply rail VDD_N is driven by an inverting buck-boost converter.

Figure 1A:
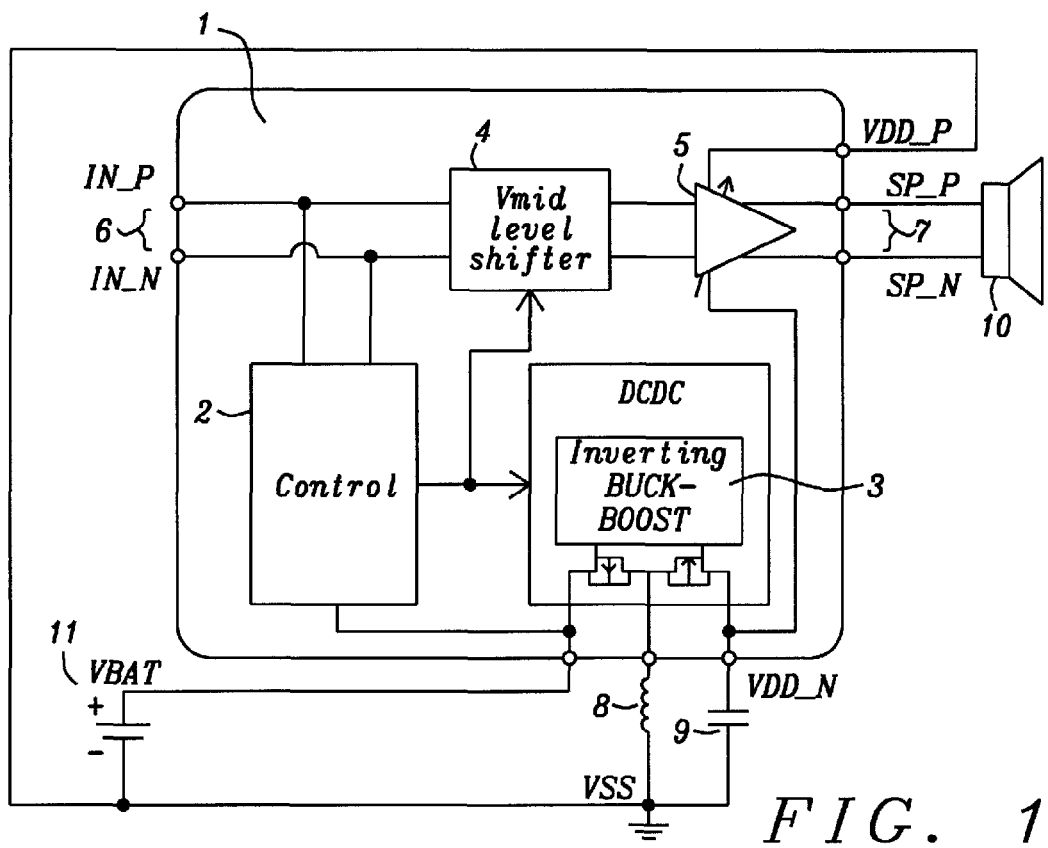
FIG. 1a shows a block diagram of the boosted H-class amplifier of the present disclosure.

FIG. 1a shows a block diagram of a boosted H-class amplifier of the present disclosure. It depicts an integrated circuit 1 comprising an amplifier control block 2, an inverting buck-boost converter 3, a Vmid level shifter 4, and the modified differential H-class amplifier 5.

The differential H-class amplifier 5 could be either a linear amplifier, which is preferred for noise sensitive applications and for achieving low EMI, or a switching amplifier, which is preferred in case maximum efficiency is required. The negative supply rail of the amplifier 5 is provided by the inverting buck-boost converter 3 with an output voltage regulated in a way to implement a boosted class H amplifier 5.

As a result of the variable VDD_N voltage the common rail level of the differential amplifier output ports SP_P and SP_N will change dynamically:

$$Vmid = (VDD\_P + VDD\_N)/2.$$

This dynamically changing of the output ports is no issue for the differential speaker signal because DC-offset at the positive and negative output ports subtracts to zero at the connected speaker input, but the amplifier's input circuitry requires the common rail tracking level shifter 4 shifting the common rail level to Vmid according to the equation above.

Furthermore FIG. 1a shows the differential input voltage 6, the differential output voltage 7, the loudspeaker 10, and the battery 11. The amplifier 5 is supplied by the positive battery voltage VDD_P and by the output of the inverting buck-boost converter 3. Moreover FIG. 1a shows an inductance 8 and a capacitor 9 used for DC/DC conversion by the inverting buck-boost converter 3. In a preferred embodiment of the disclosure inductance 8 and capacitor 9 are deployed external to the IC 1.

The amplifier of the present disclosure avoids limited loudness of applications driving small speakers from supplied by a limited supply voltage (e.g. batteries) as experienced by prior art. Furthermore EMI and cross talk issues of switching amplifiers used for maximum output power can be avoided when using a linear amplifier.

There is no need for undesirable discontinuous switching modes or other DC/DC efficiency improvements because light load isn't expected to be a typical use case for mini-speakers. As a result noise sensitive applications may disable discontinuous switching of the inverting buck-boost without a big impact on overall battery playtime.

Therefore the inverting buck-boost converter is less complex, less costly, and provides a higher efficiency than a real buck-boost converter (no serial switches needed).

In the embodiment illustrated in FIG. 1a the signal envelope controlled supply voltage (Class H) is creating then an infinitely variable negative supply rail. This is done by modulating the negative supply rail so that the voltage at the negative rail is only a bit larger than required by the output signal of the amplifier at any given time. The output stage of the amplifier operates than at its maximum efficiency all the time.

In summary the disclosure disclosed describes a solution to solve the problem of limited electrical speaker amplifier output power available, e.g. inside battery driven applications.

The disclosed solution is a differential boosted class H speaker amplifier with an inverted single side class H supply rail.

It uses a variable supply rail generated by an inverting buck-boost converter. The negative supply rail is regulated from the envelope of the audio input signal (class H). This creates a dynamically changing common rail voltage level, which in case of differential speaker amplifier outputs should be no issue as the common rail voltage is subtracted at the speaker's inputs.

The inverting buck-boost topology allows a simple and power-efficient architecture of the DC/DC converter.

A linear amplifier will overcome EMI problems, especially important for target applications sensitive to switching noise (e.g. telecom). The average power from the battery is optimized by implementing a class H regulation scheme.

If switching noise is no issue the same power supply concept can be used to drive a class D amplifier that will further reduce the average power drawn from the battery.

Figure 2A:
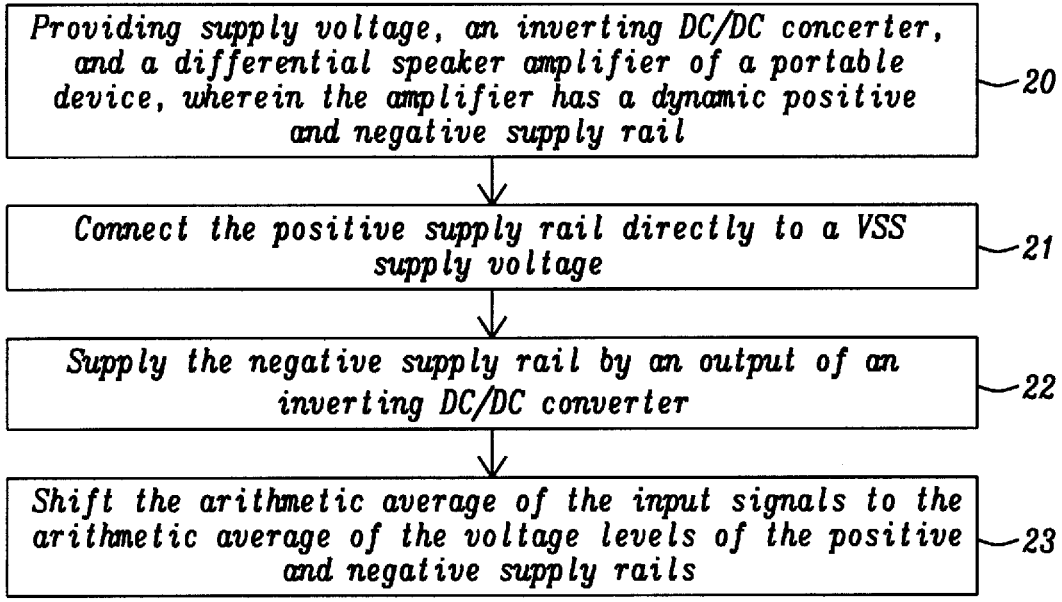
FIG. 2a is a flowchart illustrating a method disclosed to provide a differential audio amplifier generating an output signal free or with only very limited clipping.

FIG. 2a is a flowchart illustrating a method to achieve a differential audio amplifier generating an output signal free or with only very limited clipping according to the circuit of FIG. 1a. The first step 20 of the method illustrates a provision of a supply voltage, an inverting DC/DC converter, and a differential speaker amplifier of a portable device, wherein the amplifier has dynamic positive and negative supply rails. In a preferred embodiment of the disclosure the supply voltage is provided by a battery, any other voltages sources could be deployed as well. Furthermore in a preferred embodiment of the disclosure the DC/DC converter deployed is an inverting buck-boost converter. The amplifier deployed could be a linear amplifier, a Class D amplifier, or other types of amplifiers. The next step 21 describes connecting the positive supply rail directly to VSS supply voltage. Step 22 depicts supplying the negative supply rail by an output of the inverting DC/DC converter which is receiving the positive battery voltage as input voltage. Step 23 discloses shifting the arithmetic average of the input signals to the arithmetic average of the voltage levels of the positive and negative supply rails.

Figure 1B:
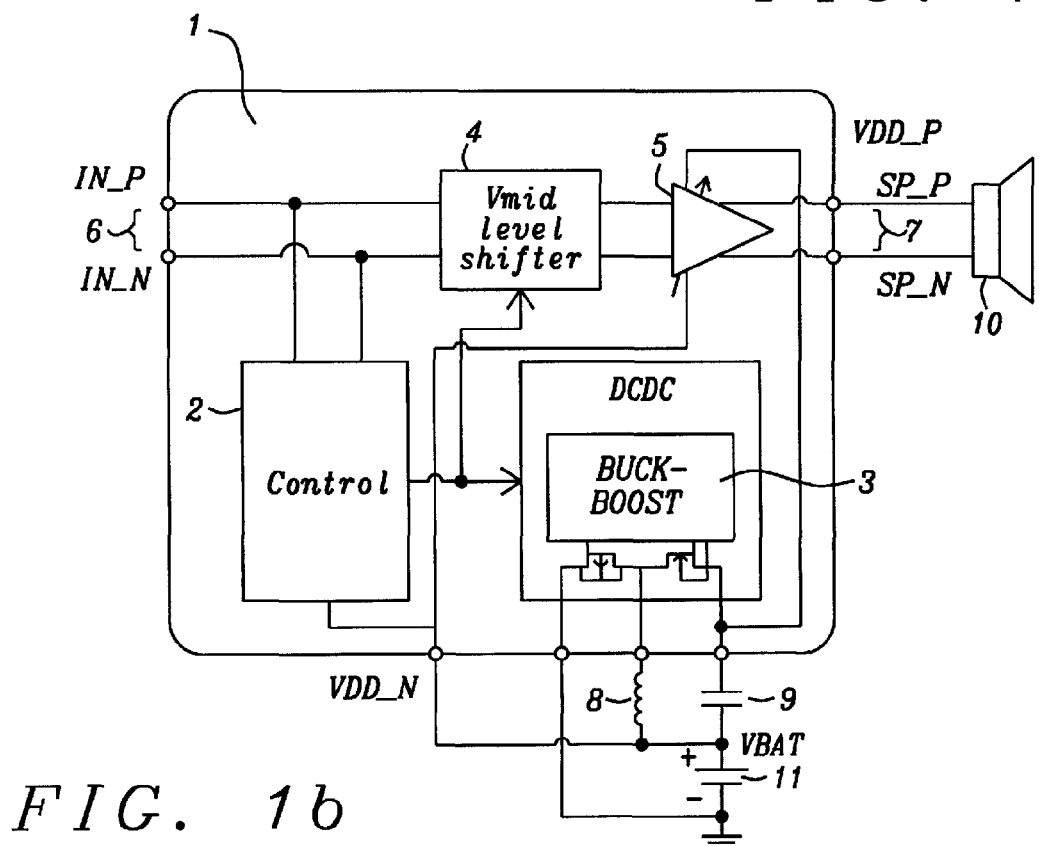
FIG. 1b shows a block diagram of an alternative boosted H-class amplifier of the present disclosure.

FIG. 1b shows a block diagram of an alternative boosted H-class amplifier of the present disclosure. The alternative circuit shows a boost converter with the battery voltage VBAT as offset. It should be noted that the circuit of FIG. 1b implements buck-boost functionality by using a modified standard boost architecture, i.e. by connecting the negative supply rail of the audio amplifier towards VBAT (instead of GND), but this solution, as the implementation of FIG. 1a, also doesn't require switches in series and doesn't have issues from irregular switching pattern when Vout is close to Vin (as is the case for standard buck-boost converters).

In the embodiment illustrated in FIG. 1b the signal envelope controlled supply voltage (Class H) is creating then an infinitely variable positive supply rail. This is done by modulating the positive supply rail so that the voltage at the positive rail is only a bit larger than required by the output signal of the amplifier at any given time.

Figure 2B:
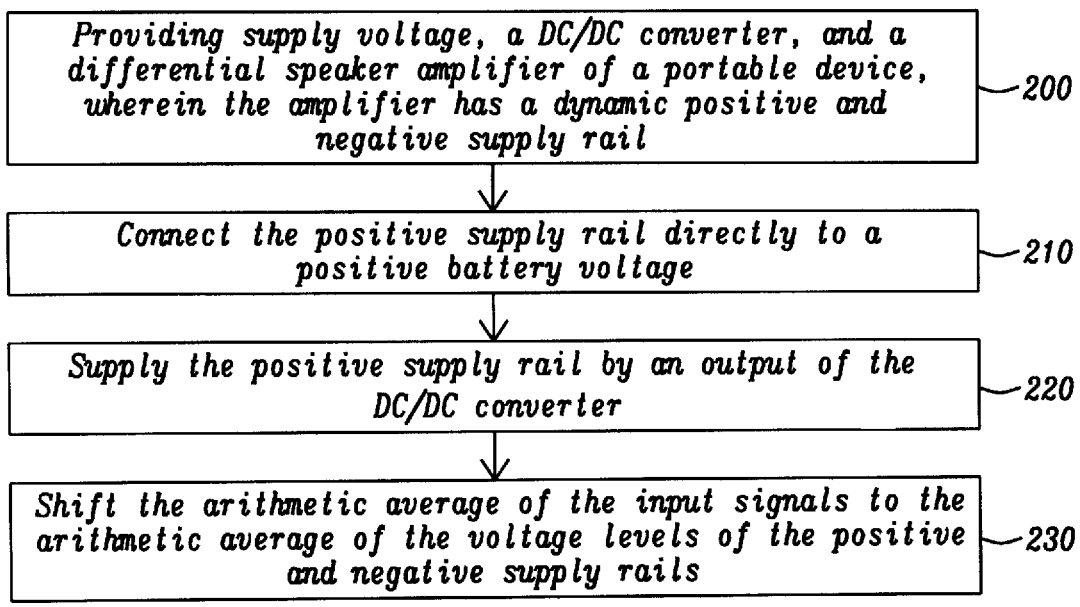
FIG. 2b is a flowchart illustrating an alternative method disclosed to provide a differential audio amplifier generating an output signal free or with only very limited clipping.

FIG. 2b is a flowchart illustrating a method to achieve a differential audio amplifier generating an output signal free or with only very limited clipping according to the circuit of FIG. 1b. The first step 200 of the method illustrates a provision of a supply voltage, a DC/DC converter, and a differential speaker amplifier of a portable device, wherein the amplifier has dynamic positive and negative supply rails, of a supply voltage. In a preferred embodiment of the disclosure the supply voltage is provided by a battery, any other voltages sources could be deployed as well. Furthermore in a preferred embodiment of the disclosure the DC/DC converter deployed is a buck-boost converter. The amplifier deployed could be a linear amplifier, a Class D amplifier, or other types of amplifiers. The next step 210 describes connecting the negative supply rail directly to the positive battery voltage. Step 220 depicts supplying the positive supply rail by an output of the DC/DC converter. Step 2303 discloses shifting the arithmetic average of the input signals to the arithmetic average of the voltage levels of the positive and negative supply rails.

While the disclosure has been particularly shown and described with reference to the preferred embodiments thereof, it will be understood by those skilled in the art that various changes in form and details may be made without departing from the spirit and scope of the disclosure.

What is claimed is:

1. A method to achieve a differential audio amplifier, wherein a supply voltage of the amplifier is regulated by an envelope of audio signals, generating output signals free or with only very limited clipping comprising the steps of:
   providing a supply voltage, an inverting buck-boost DC/DC converter, a Vmid level shifter, a control block, capable of controlling said buck-boost DC/DC converter, and a differential speaker amplifier of a portable device, wherein the differential speaker amplifier has dynamic positive and negative supply rails;
   connecting the positive supply rail directly to a negative port of the supply voltage;
   supplying the negative supply rail of the differential speaker amplifier by an output of the inverting buck-boost DC/DC converter, which is connected to a positive port of the supply voltage as input voltage, wherein the control block controls the operation of the inverting buck-boost DC/DC converter; and
   shifting the arithmetic average of input signals of the differential audio amplifier to an arithmetic average of the voltage levels of the positive and negative supply rails by the Vmid level shifter, wherein the input signals of the differential audio amplifier comprise a positive input signal and a negative input signal.

2. The method of claim 1 wherein said differential speaker amplifier is a linear amplifier.

3. The method of claim 1, wherein said differential speaker amplifier is a Class D amplifier.

4. The method of claim 1, wherein the negative supply rail, supplied by the output of the inverting DC/DC converter, is regulated from an envelope of the input signal to implement a boosted class H amplifier.

5. The method of claim 4, wherein the signal envelope controlled negative supply rail is creating an infinitely variable negative supply rail.

6. The method of claim 5, wherein the negative supply rail is modulated in a way that the voltage at the negative supply rail is only slightly larger than required by the output signal at any given time, wherein the negative supply rail is regulated from the envelope of the input signal of the differential audio amplifier by the control block.

7. The method of claim 5, wherein the supply voltage is a battery voltage.

8. A differential audio amplifier system configured to generate an output signal, free or with only very limited clipping, comprising:
   a differential amplifier having differential inputs and differential outputs and positive and negative supply rails, wherein the inputs are the outputs of a Vmid level shifter;
   a port for supply voltage;
   said Vmid level shifter configured to receive a differential audio signal input, wherein the level shifter is configured to shift the arithmetic average of the input signals to the arithmetic average of the voltage levels of the positive and negative supply rails;
   said positive and negative supply rails comprising a positive supply rail directly connected to VSS voltage of the supply voltage and a negative supply rail connected to an output of an inverting DC/DC converter;
   said inverting DC/DC converter configured to supply said negative supply rail; and
   a control block configured to receive inputs from the input signals and controlling said DC/DC converter and said Vmid level shifter.

9. The system of claim 8, wherein said differential amplifier is a linear amplifier.

10. The system of claim 8, wherein said differential amplifier is a Class D amplifier.

11. The system of claim 8, wherein said supply voltage is provided by a battery.

12. The system of claim 8, further comprising one integrated circuit (IC), wherein the one IC comprises the amplifier, the Vmid level shifter, the control block, and the DC/DC converter.

13. The system of claim 8, wherein said inverting DC/DC converter is an inverting buck-boost converter.

14. A method to achieve a differential audio amplifier generating an output signal free or with only very limited clipping comprising the steps of:
- providing a supply voltage, a DC/DC converter, and a differential speaker amplifier of a portable device, wherein the amplifier has dynamic positive and negative supply rails;
- connecting the negative supply rail directly to a positive battery voltage;
- supplying the positive supply rail by an output of the DC/DC converter; and
- shifting the arithmetic average of input signals of the differential audio amplifier to an arithmetic average of the voltage levels of the positive and negative supply rails by the Vmid level shifter, wherein the input signals of the differential audio amplifier comprise a positive input signal and a negative input signal.

15. The method of claim 14 wherein said amplifier is a linear amplifier.

16. The method of claim 14, wherein said amplifier is a Class D amplifier.

17. The method of claim 14, wherein said DC/DC converter is a buck-boost converter.

18. The method of claim 14, wherein the positive supply rail, supplied by the output of the inverting DC/DC converter, is regulated from an envelope of the input signal to implement a boosted class H amplifier, wherein the control block controls the operation of the inverting DC/DC converter.

19. The method of claim 18, wherein the signal envelope controlled positive supply rail is creating an infinitely variable positive supply rail.

20. The method of claim 19, wherein the positive supply rail is modulated in a way that the voltage at the positive supply rail is only slightly larger than required by the output signal at any given time, wherein the positive supply rail is regulated from the envelope of the input signal of the differential audio amplifier by the control block.

21. The method of claim 14, wherein the supply voltage is a battery voltage.

22. A differential audio amplifier system configured to generate an output signal, free or with only very limited clipping, comprising:
- a differential amplifier having differential inputs and differential outputs and positive and negative supply rails, wherein the inputs are the outputs of a Vmid level shifter;
- a port for supply voltage;
- said Vmid level shifter configured to receive a differential audio signal input, wherein the level shifter is configured to shift the arithmetic average of the input signals to the arithmetic average of the voltage levels of the positive and negative supply rails;
- said positive and negative supply rails comprising a negative supply rail directly connected to a positive battery voltage and a positive supply rail connected to an output of a DC/DC converter;
- said DC/DC converter configured to supply said positive supply rail; and
- a control block configured to receive inputs from the input signals and controlling said DC/DC converter and said Vmid level shifter.

23. The system of claim 22, wherein said differential amplifier is a linear amplifier.

24. The system of claim 22, wherein said differential amplifier is a Class D amplifier.

25. The system of claim 22, wherein said supply voltage is provided by a battery.

26. The system of claim 22, further comprising one integrated circuit (IC), wherein the one IC comprises the amplifier, the Vmid level shifter, the control block, and the DC/DC converter.

27. The system of claim 22, wherein said inverting DC/DC converter is a buck-boost converter.

28. The system of claim 8, wherein the negative supply rail, supplied by the output of the inverting DC/DC converter, is regulated from an envelope of the input signal to implement a boosted class H amplifier.

29. The system of claim 28, wherein the signal envelope controlled negative supply rail is creating an infinitely variable negative supply rail.

30. The system of claim 29, wherein the negative supply rail is modulated in a way that the voltage at the negative supply rail is only slightly larger than required by the output signal at any given time, wherein the negative supply rail is regulated from the envelope of the input signal of the differential audio amplifier by the control block.

31. The system of claim 22, wherein the negative supply rail, supplied by the output of the inverting DC/DC converter, is regulated from an envelope of the input signal to implement a boosted class H amplifier.

32. The system of claim 31, wherein the signal envelope controlled negative supply rail is creating an infinitely variable negative supply rail.

33. The system of claim 32 wherein the negative supply rail is modulated in a way that the voltage at the negative supply rail is only slightly larger than required by the output signal at any given time, wherein the negative supply rail is regulated from the envelope of the input signal of the differential audio amplifier by the control block.

* * * * *